United States Patent
Lee et al.

(10) Patent No.: US 10,790,789 B2
(45) Date of Patent: Sep. 29, 2020

(54) INJECTION LOCK POWER AMPLIFIER WITH BACK-GATE BIAS

(71) Applicant: GLOBALFOUNDRIES INC., Grand Cayman (KY)

(72) Inventors: See T. Lee, Allen, TX (US); Abdellatif Bellaouar, Richardson, TX (US)

(73) Assignee: GLOBALFOUNDRIES INC., Grand Cayman, KY (US)

( * ) Notice: Subject to any disclaimer, the term of this patent is extended or adjusted under 35 U.S.C. 154(b) by 0 days.

(21) Appl. No.: 16/550,385

(22) Filed: Aug. 26, 2019

(65) Prior Publication Data

US 2019/0379338 A1    Dec. 12, 2019

Related U.S. Application Data

(63) Continuation of application No. 15/933,542, filed on Mar. 23, 2018, now Pat. No. 10,469,039.

(51) Int. Cl.
*H03F 3/68*    (2006.01)
*H03F 1/56*    (2006.01)
(Continued)

(52) U.S. Cl.
CPC ........... *H03F 1/565* (2013.01); *H03B 5/1228* (2013.01); *H03F 3/193* (2013.01); *H03F 3/245* (2013.01);
(Continued)

(58) Field of Classification Search
CPC .......... H03F 1/565; H03F 3/245; H03F 3/193; H03F 3/26; H03F 2200/541; H03F 3/265;
(Continued)

(56) References Cited

U.S. PATENT DOCUMENTS 7,834,686 B2    11/2010  Staszewski et al.
8,493,136 B2     7/2013  Bellaouar et al.
(Continued)

OTHER PUBLICATIONS

Chee et al., "An Ultra-Low-Power Injection Locked Transmitter for Wireless Sensor Networks," IEEE Journal of Solid-State Circuits, vol. 41, No. 8, 2006, pp. 1740-1748.
(Continued)

*Primary Examiner* — Khanh V Nguyen
(74) *Attorney, Agent, or Firm* — Gibb & Riley, LLC; David A. Cain, Esq.

(57) ABSTRACT

In an exemplary structure, a transformer has a primary side and a secondary side. Output from the primary side is coupled to the secondary side. A first power supply is connected to a center tap of the primary side of the transformer. An oscillator includes a first transistor and a second transistor. The front-gate of the first transistor is connected to the drain of the second transistor and the primary side of the transformer. The front-gate of the second transistor is connected to the drain of the first transistor and the primary side of the transformer. A third transistor is connected to the first transistor and a fourth transistor is connected to the second transistor. The third and fourth transistors inject a desired frequency to the oscillator. A voltage source is connected to the back-gate of the first transistor and the back-gate of the second transistor.

18 Claims, 4 Drawing Sheets

(51) Int. Cl.
*H03F 3/24* (2006.01)
*H03F 3/193* (2006.01)
*H03B 5/12* (2006.01)
*H03F 3/195* (2006.01)
*H03F 3/26* (2006.01)

(52) U.S. Cl.
CPC ............... *H03F 3/195* (2013.01); *H03F 3/26* (2013.01); *H03F 2200/541* (2013.01)

(58) Field of Classification Search
CPC ............ H03F 1/347; H03F 2200/534; H03F 3/45183; H03F 2203/45621; H03F 2203/45731; H03F 2203/45318; H03F 2203/45481; H03F 3/195; H03F 3/22; H03B 5/1228; H03B 5/12; H03B 5/1212; H03B 2200/0074
USPC ................................ 330/195, 197, 276, 295
See application file for complete search history.

(56) References Cited

U.S. PATENT DOCUMENTS

| | | | |
|---|---|---|---|
| 8,554,162 | B2 | 10/2013 | Lindstrand et al. |
| 10,171,053 | B2 | 1/2019 | Soliman |
| 10,511,273 | B2 * | 12/2019 | Al-Shyoukh ........... H02J 50/80 |
| 2006/0006950 | A1 | 1/2006 | Burns et al. |
| 2012/0268190 | A1 | 10/2012 | Bellaouar et al. |
| 2014/0375391 | A1 | 12/2014 | Park et al. |

OTHER PUBLICATIONS

Lin et al., "A 50-59 GHz CMOS Injection Locking Power Amplifier," IEEE Microwave and Wireless Components Letters, vol. 25, No. 1, 2015, pp. 52-54.

U.S. Appl. No. 15/933,542, Office Action Communication dated Mar. 21, 2019, pp. 1-9.

U.S. Appl. No. 15/933,542, Notice of Allowance dated Jul. 24, 2019, pp. 1-9.

* cited by examiner

INJECTION LOCK POWER AMPLIFIER WITH BACK-GATE BIAS

CROSS-REFERENCE TO RELATED APPLICATIONS

This application claims the benefit under 35 U.S.C. § 120 as a continuation of U.S. patent application Ser. No. 15/933,542 filed on Mar. 23, 2018, the entire teachings of which are incorporated herein by reference.

BACKGROUND

The present disclosure relates to amplifiers, and, more specifically, to power amplifiers using injection lock that is controlled by back-gate bias.

Current wireless technology trends towards increasing numbers of wireless standards and radio frequency (RF) bands to support wireless communications have led to the development of multi-standard, multi-band cellular systems. Such efforts have produced well-performing wideband receivers and frequency synthesizers. However, power amplifiers having the desired performance, output power, etc., across multiple frequency bands remains a challenge for such cellular systems.

Due to the fast-growing demand of wireless communication, a CMOS transceiver has been developed and has become available for the commercial market. However, there are still technical obstacles to achieve widespread application of millimeter-wave (mmWave) CMOS applications, especially in the design of Power Amplifier (PA). For example, the gain of a CMOS transistor at 60 GHz is typically small, so multiple-stage design is usually employed in order to obtain higher gain. In addition, power combining technology can be a solution to CMOS's low output power. However, the efficiency of a CMOS PA is usually low due to the poor RF performance of the transistor. Techniques, such as multi-stage design would further reduce the overall efficiency. An Injection Locking Power Amplifier (ILPA) can achieve high efficiency at 60 GHz in addition to providing high gain with a compact size. However, there are some major drawbacks of the ILPA.

Using current sources to tune the injection current and oscillator core current increases the headroom required and possibility of noise up-conversion. AC-coupling with resistor bias to de-coupled the DC biases in the oscillator core increases the loss, especially for mmWave applications.

SUMMARY

According to devices and methods herein, back-gate bias available from fully-depleted semiconductor-on-insulator (FDSOI) technology is used to tune the injection current and oscillator core current independently. The back-gate voltages of both differential pairs can be tuned independently as well to obtain symmetric outputs. Small devices can be used for mmWave application, which reduces the input load and thus lowers the power consumption and maximizes the operating frequency.

According to an exemplary structure herein, a transformer has a primary side and a secondary side. Output from the primary side is coupled to the secondary side. A first power supply is connected to a center tap of the primary side of the transformer. An oscillator includes a first transistor and a second transistor. The front-gate of the first transistor is connected to the drain of the second transistor and the primary side of the transformer. The front-gate of the second transistor is connected to the drain of the first transistor and the primary side of the transformer. A third transistor is connected to the first transistor and a fourth transistor is connected to the second transistor. The third and fourth transistors inject a desired frequency to the oscillator. A voltage source is connected to the back-gate of the first transistor and the back-gate of the second transistor.

According to other exemplary structures herein, a transformer has a primary side and a secondary side. Output from the primary side is coupled to the secondary side. A first power supply is connected to a center-tap of the primary side of the transformer. The structure includes a pair of switching transistors. Each transistor of the pair of switching transistors includes a source node, a front-gate node, a back-gate node, and a drain node. The pair of switching transistors are cross-coupled such that the drain node of each one of the switching transistors is connected to the front-gate node of the other switching transistor, and the drain nodes are connected to the primary side of the transformer. The structure also includes a pair of injection transistors. Each transistor of the pair of injection transistors includes a source node, a front-gate node, a back-gate node, and a drain node. The drain node of each one of the injection transistors is connected to the drain node of one of the switching transistors and the source node of each of the injection transistors is connected to the source node of each of the switching transistors. An injection signal is connected to the front-gate of each transistor of the pair of injection transistors, and a bias voltage source is connected to the back-gate of each transistor of the pair of switching transistors.

According to exemplary methods herein, a pair of switching transistors is cross coupled such that the drain node of each one of the switching transistors is connected to the front-gate node of the other switching transistor. The drain nodes of each one of the switching transistors are connected to the primary side of a transformer. An injection current is provided to the pair of switching transistors to oscillate the transformer. Output power from the secondary side of the transformer is measured. It is determined if output power from both sides of the transformer are approximately equal. Responsive to the output power from both sides of the transformer not being approximately equal, output power of the switching transistors is controlled by adjusting voltage to the back-gate of the switching transistors.

BRIEF DESCRIPTION OF THE DRAWINGS

The devices and methods herein will be better understood from the following detailed description with reference to the drawings, which are not necessarily drawn to scale and in which.

DETAILED DESCRIPTION

Figure 1:
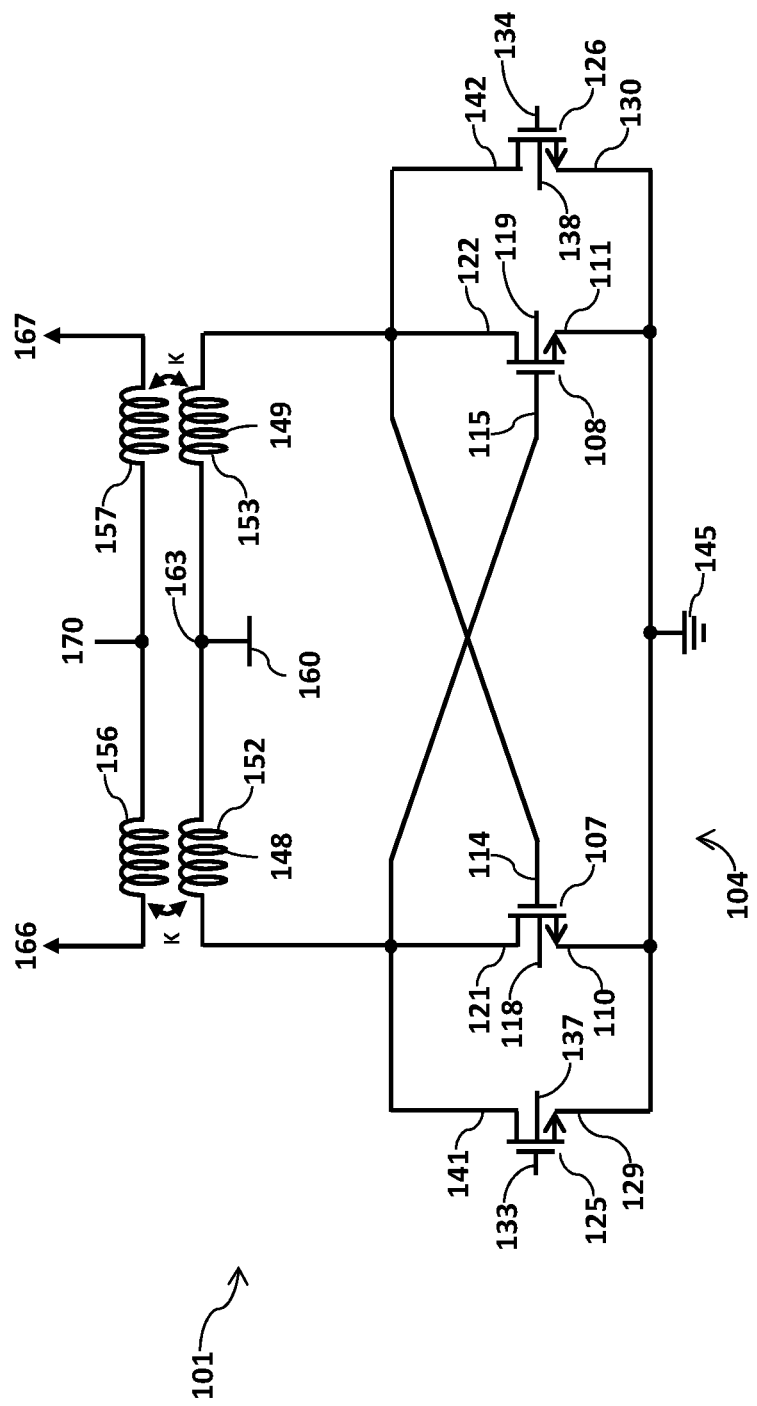
FIG. 1 is a schematic diagram of an exemplary power amplifier according to devices and methods herein.

The disclosure will now be described with reference to an injection locked power amplifier that uses back-gate bias of fully-depleted semiconductor-on-insulator (FDSOI) transistors to tune the injection current and oscillator core current independently during operation of the power amplifier. While the disclosure will be described hereinafter in connection with specific devices and methods thereof, it will be understood that limiting the disclosure to such specific devices and methods is not intended. On the contrary, it is intended to cover all alternatives, modifications, and equivalents as may be included within the spirit and scope of the disclosure as defined by the appended claims.

For a general understanding of the features of the disclosure, reference is made to the drawings. The drawings are not to scale; however, in the drawings, like reference numerals have been used throughout to identify identical elements.

It will be readily understood that the devices and methods of the present disclosure, as generally described and illustrated in the drawings herein, may be arranged and designed in a wide variety of different configurations in addition to the devices and methods described herein. Thus, the following detailed description of the devices and methods, as represented in the drawings, is not intended to limit the scope defined by the appended claims but is merely representative of selected devices and methods. The following description is intended only by way of example, and simply illustrates certain concepts of the devices and methods, as disclosed and claimed herein.

According to devices and methods herein, a structure includes a cross-coupled pair of transistors, referred to herein as switching transistors, that provides the negative resistance loaded to the primary of a transformer. The center-tap of the primary of the transformer is connected to the power supply. The output from the primary is coupled to the secondary of the transformer. The secondary of the transformer can have either differential or single-ended outputs. An injection current is provided from injection transistors. The primary inductance of the transformer is designed such that the oscillator core is oscillating close to the desired operating frequency. In operation, the injection transistors inject the desire frequency and the oscillator will finally lock to the injected frequency. The back-gate of the cross-coupled switching transistors is used to change the oscillator core current and subsequently the output power. The lock-in range is proportional to the injection current. This can be accomplished by changing the back-gate bias of the injection transistors. Any transistor mismatches between the cross-coupled switching transistors and the injection transistors can be tuned out by applying different back-gate biases in each of the transistors and thus minimum transistor size can be used. For single-ended output, the transformer can be configured as a balun where one of the secondaries is connected to ground. Due to this configuration, the input impedance seen on each input of the primary can have some difference and thus create asymmetry output swings in the primary outputs. The back-gate bias to the cross-coupled transistors can be used to calibrate out this asymmetry as well.

The cross-coupled pair of switching transistors with the inductances from the transformer can oscillate with a well-defined oscillating frequency ($f_{osc}$). Using the injection current through the injection transistors, the injection locked power amplifier (ILPA) can be tuned to the input frequency ($f_{in}$). The tuning range can be controlled through the back-gate voltage to the injection transistors. The oscillating frequency ($f_{osc}$) may be approximately in the mid-range of locked input frequency ($f_{in}$). Back-gate bias to the cross-coupled pair of switching transistors controls the output power. Note that the ratio of injection current to the current in the oscillator can be kept to a desired constant number since the back-gate bias to the switching transistors and the injection transistors are controlled independently. Each back-gate control can be either common or independent to the differential pair.

Referring now to the drawings, FIG. 1 is a schematic diagram of an exemplary power amplifier, indicated generally as 101. The power amplifier 101 may include an oscillator 104 that includes a pair of switching transistors. Within a transistor, the semiconductor (or channel region) is positioned between a conductive "source" region and a similarly conductive "drain" region and when the semiconductor is in a conductive state, the semiconductor allows electrical current to flow between the source and drain. A "gate" is a conductive element that is electrically separated from the semiconductor by a "gate oxide" (which is an insulator) and current/voltage within the gate changes the conductivity of the channel region of the transistor. Each transistor 107, 108 of the pair of switching transistors is a fully-depleted semiconductor-on-insulator (FDSOI) transistor. FDSOI is a planar process technology that uses an ultra-thin layer of insulator, called a buried oxide, positioned on top of the base silicon. A very thin un-doped silicon film implements the transistor channel. The details of FDSOI transistors are omitted herefrom to allow the reader to focus on the salient aspects of the systems and methods described herein.

Each transistor 107, 108 of the pair of switching transistors includes a source node 110, 111, a front-gate node 114, 115, a back-gate node 118, 119, and a drain node 121, 122. The pair of switching transistors are cross-coupled such that the drain node of each one of the switching transistors is connected to the front-gate node of the other switching transistor. For example, the drain node 121 of switching transistor 107 is connected to the front-gate node 115 of switching transistor 108 and the drain node 122 of switching transistor 108 is connected to the front-gate node 114 of switching transistor 107. As used herein, the switching transistors 107, 108 may sometimes be referred to as M1 and M2.

The power amplifier 101 may include a pair of injection transistors. Each transistor 125, 126 of the pair of injection transistors is a FDSOI transistor that includes a source node 129, 130, a front-gate node 133, 134, a back-gate node 137, 138, and a drain node 141, 142. The drain node of each one of the injection transistors is connected to the drain node of one of the switching transistors and the source node of each of the injection transistors is connected to the source node of each of the switching transistors. That is, the drain node 121 of switching transistor 107 is connected to the drain node 141 of injection transistor 125 and the drain node 122 of switching transistor 108 is connected to the drain node 142 of injection transistor 126. Further, the source node 110 of switching transistor 107 is connected to the source node 129 of injection transistor 125 and the source node 111 of switching transistor 108 is connected to the source node 130 of injection transistor 126, all of which are connected to ground 145. As used herein, the injection transistors 125, 126 may sometimes be referred to as M1INJ and M2INJ.

The oscillator 104 provides a signal output at a selected frequency to a pair of transformers. Each transformer 148, 149 of the pair of transformers includes windings on a primary side 152, 153 and windings on a secondary side 156, 157. The ratio K of windings between the primary side 152, 153 and the secondary side 156, 157 for each of transformer 148, 149 should be the same. A first power supply 160 is connected to a center tap 163 on the primary side between transformer 148 and transformer 149. RF output 166, 167 from the secondary side 156, 157 of each transformer 148, 149 can be used, for example, in RADAR or wireless cellular communication applications, or other applications as would be known to one of ordinary skill in the art. A DC bias voltage for the RF output 166, 167 can be provided at 170 on the secondary side between transformer 148 and transformer 149.

An injection signal source is connected to the front-gate node 133, 134 of each transistor 125, 126 of the pair of injection transistors. Input to the back-gate nodes 137, 138 of the injection transistors 125, 126 can change the injection current and minimize the input load. A bias voltage source is connected to the back-gate node 118, 119 of each transistor 107, 108 of the pair of switching transistors. In operation, the injection transistors 125, 126 inject the desired frequency and the oscillator 104 will lock to the injected frequency. The bias voltage input to the back-gate nodes 118, 119 of the switching transistors 107, 108 can be used to change the oscillator core current and subsequently the output power. The bias voltage input to the back-gate nodes 118, 119 of the switching transistors 107, 108 can also be used to compensate any current fluctuation due to process and/or temperature. The lock-in range is proportional to the injection current. This can be accomplished by changing the back-gate bias of the injection transistors 125, 126. In order to get fast lock-in time during start-up, the input to the back-gate nodes 137, 138 of the injection transistors 125, 126 can be initially increased; then, once the oscillator 104 is close to being locked, the injection input can be reduced to nominal to save power.

The injection current can be used to balance the amplitudes of the RF output 166, 167. For example, the input to the back-gate node 137 of injection transistor 125 is not necessarily the same as the input to the back-gate node 138 of injection transistor 126. In addition, the bias voltage input to the back-gate node 118 of switching transistor 107 is not necessarily the same as the bias voltage input to the back-gate node 119 of switching transistor 108. Both the inputs to the back-gate nodes 137, 138 of the injection transistors 125, 126 and the bias voltage inputs to the back-gate nodes 118, 119 of the switching transistors 107, 108 can be either differential or independent. In other words, each back-gate control can be either common or independent to the differential pair. Any transistor mismatches between the cross-coupled switching transistors 107, 108 and the injection transistors 125, 126 can be tuned out by applying different back-gate biases in each of the transistors and thus minimum transistor size can be used.

Figure 2:
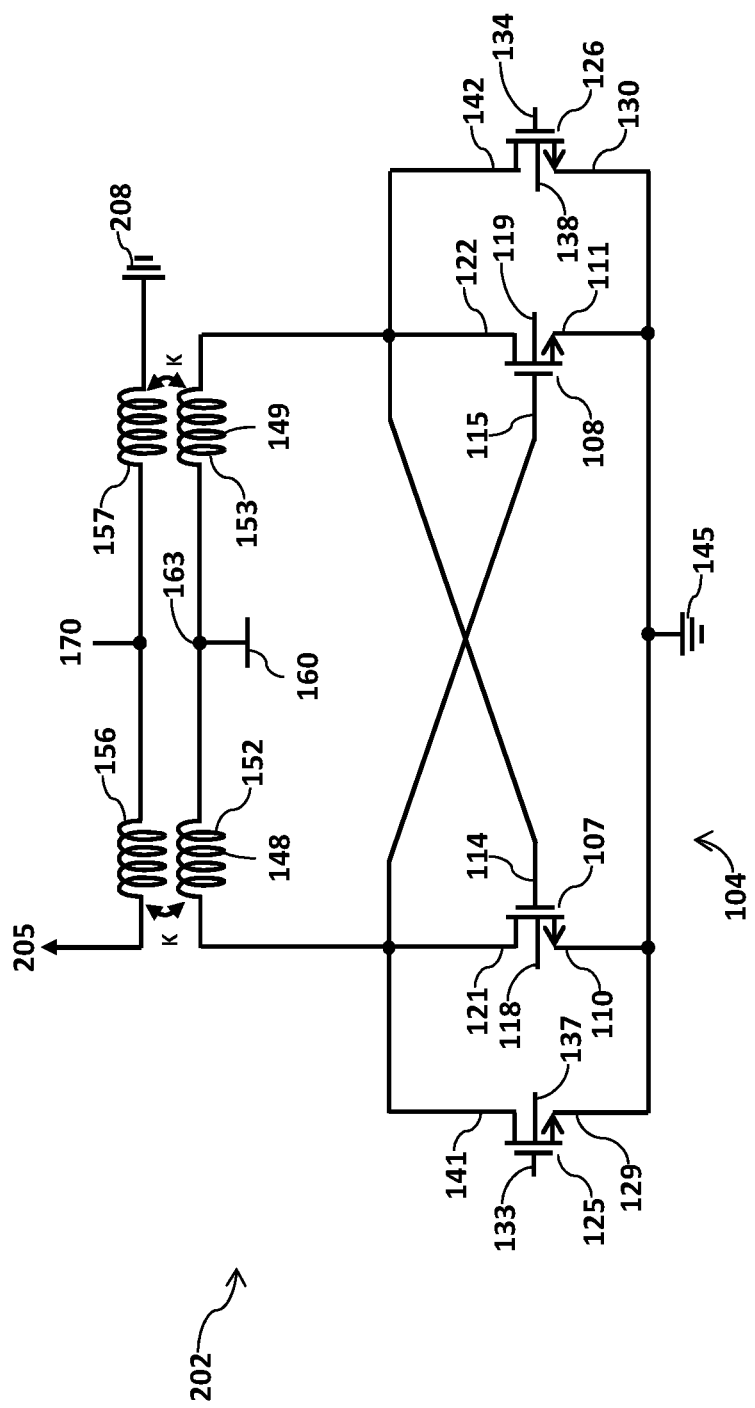
FIG. 2 is a schematic diagram of an exemplary power amplifier with a single-ended output according to devices and methods herein.

In FIG. 2, the injection locked power amplifier 202 has a single RF output 205. The output from the secondary side 157 of transformer 149 is sent to ground 208. For single-ended output, the transformer can be configured as a balun where one of the secondaries is connected to ground. Due to this configuration, the input impedance seen on each input of the primary side of the transformer can have some difference and thus create asymmetry output swings in the primary outputs. The back-gate bias to the cross-coupled transistors 107, 108 can be used to calibrate out this asymmetry.

Figure 3:
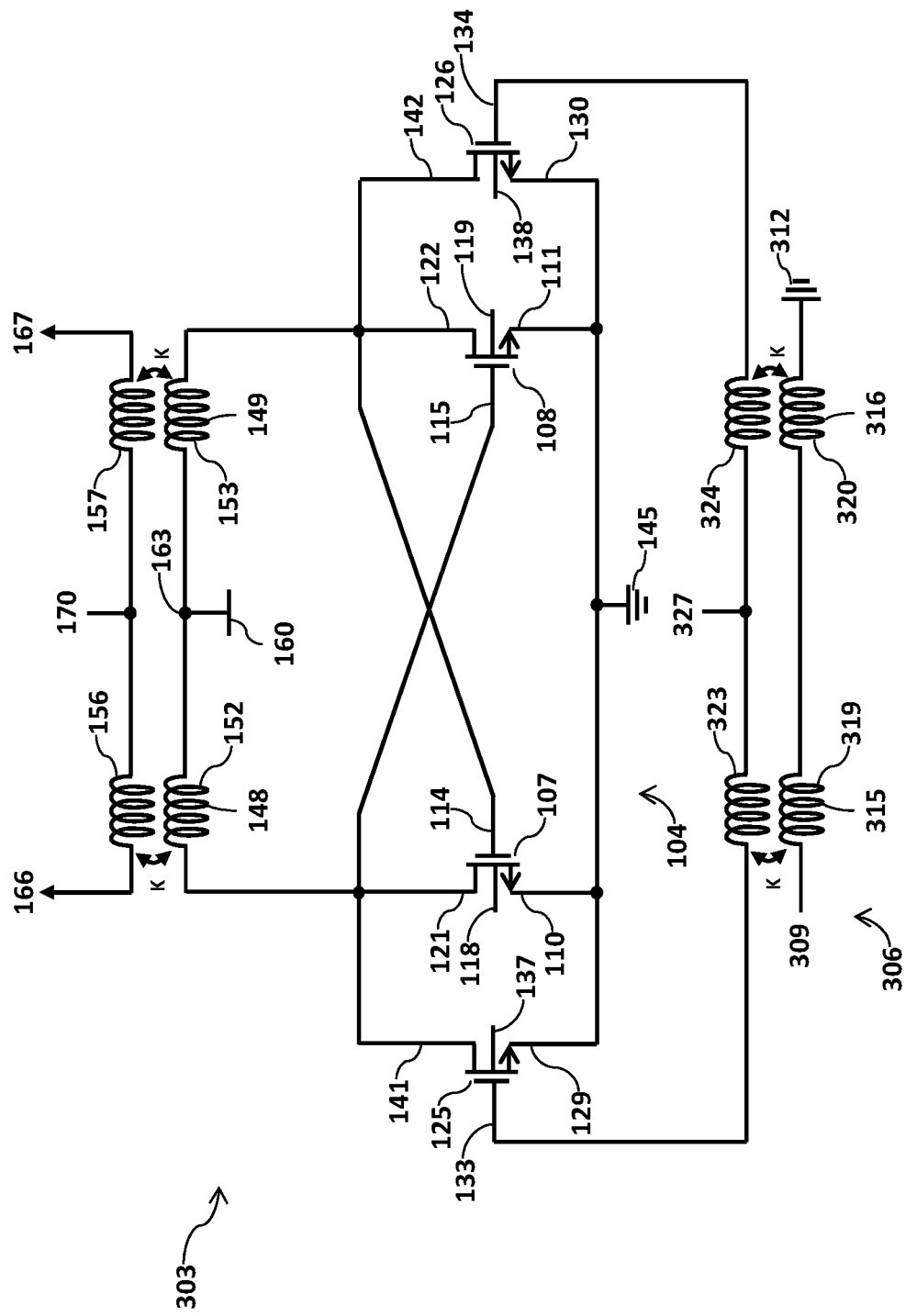
FIG. 3 is a schematic diagram of an exemplary power amplifier with a single-ended input according to devices and methods herein.

In FIG. 3, the injection locked power amplifier 303 has a single-ended input 306 for the injection transistors 125, 126. In the exemplary embodiment of FIG. 3, a pair of input transformers may have an RF input at 309 and a connection to ground 312 at the opposite end. Each input transformer 315, 316 of the pair of input transformers includes windings on a primary side 319, 320 and windings on a secondary side 323, 324. The ratio K of windings between the primary side 319, 320 and the secondary side 323, 324 for each of input transformer 315, 316 should be the same, although not necessarily the same as for transformer 148, 149. A second power supply 327 is connected between input transformer 315 and input transformer 316 on the secondary side. The second power supply 327 provides DC voltage for the injection transistors 125, 126. The output of the input transformer 315 is connected to the front-gate node 133 of injection transistor 125 and the output of the input transformer 316 is connected to the front-gate node 134 of injection transistor 126. The amount of DC voltage for the second power supply 327 can be adjusted to change the injection current for the injection transistors 125, 126; however, according to devices and methods herein, changing the back-gate bias of the injection transistors 125, 126 provides better control.

Figure 4:
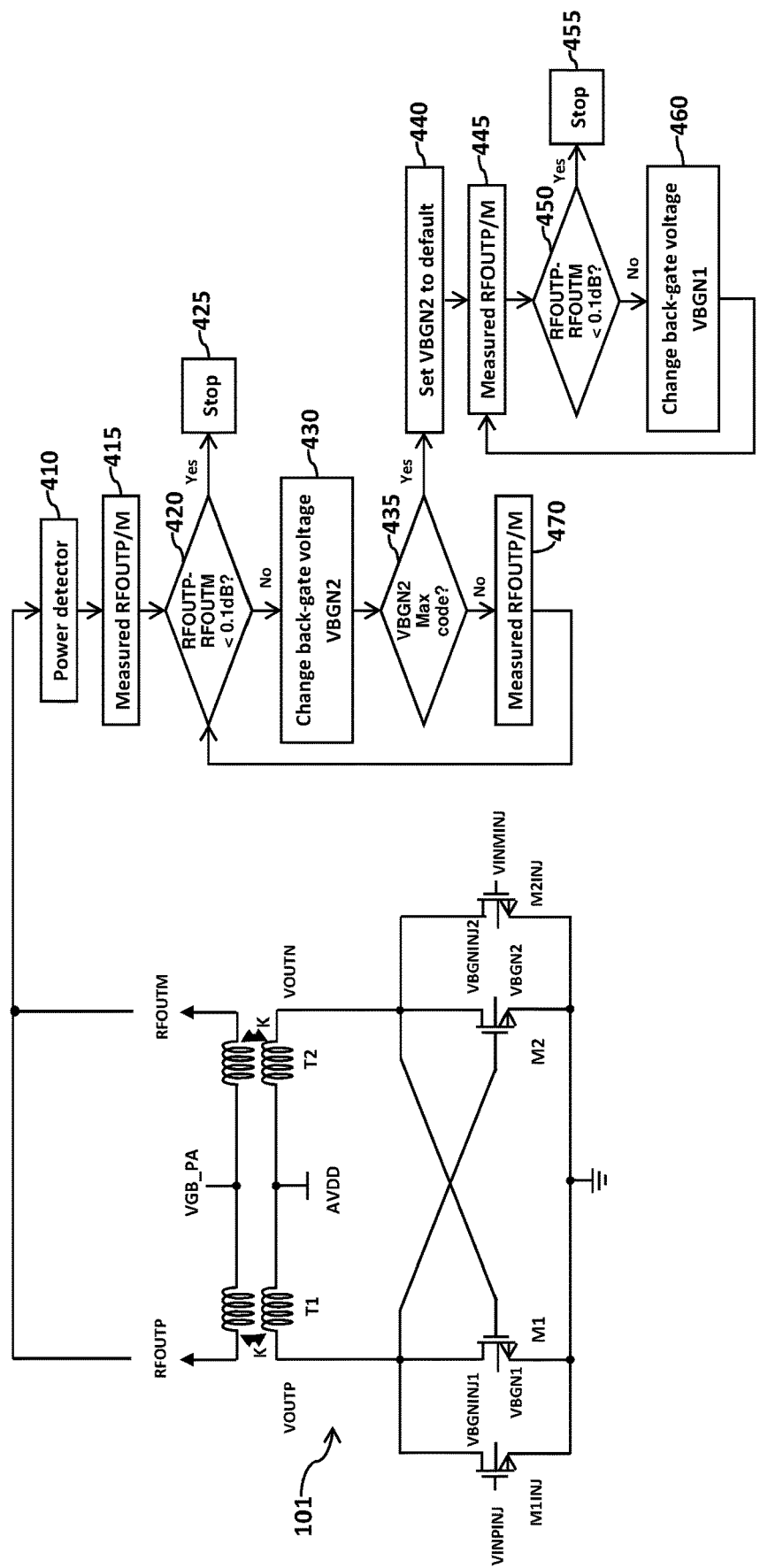
FIG. 4 is a schematic diagram of an exemplary power amplifier and an adjustment flowchart according to devices and methods herein.

FIG. 4 shows the power amplifier 101 of FIG. 1 having differential back-gate bias for the switching transistors 107, 108 (M1/M2) and includes a flow diagram illustrating the processing flow of an exemplary method to adjust power imbalance in the output from an injection locked power amplifier (ILPA), such as described above. At 410, the RF outputs 166, 167 are received by a power detector. A single power detector can be used to measure both RF outputs 166, 167 of power. At 415, the power detector measures the output power. The power detector is used for relative measurement only and not absolute measurement, so the design is much simpler. According to devices and methods herein, the power detector is used to detect leakage only. no direct connection is made to the RF outputs 166, 167, indicated as RFOUTP/RFOUTM so the outputs will not be loaded once the calibration is complete. At 420, the difference between the RF outputs 166, 167, indicated as RFOUTP/RFOUTM, is determined. If the difference is less than approximately 0.1 dB there is no need for adjustment, so the process stops, at 425. Otherwise, at 430, the back-gate voltage (VBGN2) at the back-gate node 119 of switching transistor 108 (M2) is adjusted. At 435, a check is made to see if the back-gate voltage (VBGN2) is at the maximum allowable limit. If so, at 440, the back-gate voltage (VBGN2) at the back-gate node 119 of switching transistor 108 (M2) is set to a default value. At 445, the power detector again measures the output power. As before, the power detector is used for relative measurement only and not absolute measurement. At 450, the difference between the RF outputs 166, 167, indicated as RFOUTP and RFOUTM, is determined. If the difference is less than approximately 0.1 dB there is no further adjustment, so the process stops, at 455. Otherwise, at 460, the back-gate voltage (VBGN1) at the back-gate node 118 of switching transistor 107 (M1) is adjusted. The process reverts to 445 to again measure the output power. If, at 435, after adjusting the back-gate voltage (VBGN2), it is not at the maximum allowable limit, the power detector again measures the output power, at 470. As before, the power detector is used for relative measurement only and not absolute measurement. The process reverts to 420 to again determine if the difference between the RF outputs 166, 167, indicated as RFOUTP/RFOUTM, is less than approximately 0.1 dB. While the above process begins by first adjusting the back-gate voltage (VBGN2) at the back-gate node 119 of switching transistor 108 (M2) before adjusting the back-gate voltage (VBGN1) at the back-gate node 118 of switching transistor 107 (M1), the order can be reversed. Moreover, adjusting of the back-gate voltages (VBGN1/VBGN2) can be done in any order or combination.

For electronic applications, semiconducting substrates, such as silicon wafers, can be used. The substrate enables easy handling of the micro device through the many fabrication steps. Often, many individual devices are made together on one substrate and then singulated into separated devices toward the end of fabrication. In order to fabricate a microdevice, many processes are performed, one after the other, many times repeatedly. These processes typically include depositing a film, patterning the film with the desired micro features, and removing (or etching) portions of the film. For example, in memory chip fabrication, there may be several lithography steps, oxidation steps, etching steps, doping steps, and many others are performed. The complexity of microfabrication processes can be described by their mask count.

The methods as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

The terminology used herein is for the purpose of describing particular devices and methods only and is not intended to be limiting of this disclosure. As used herein, the singular forms "a", "an", and "the" are intended to include the plural forms as well, unless the context clearly indicates otherwise. It will be further understood that the terms "comprises", "comprising", "includes", and "including", when used in this specification, specify the presence of stated features, integers, steps, operations, elements, and/or components, but do not preclude the presence or addition of one or more other features, integers, steps, operations, elements, components, and/or groups thereof.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The corresponding structures, materials, acts, and equivalents of all means or step plus function elements in the claims below are intended to include any structure, material, or act for performing the function in combination with other claimed elements as specifically claimed. The descriptions of the various devices and methods herein have been presented for purposes of illustration but are not intended to be exhaustive or limited to the devices and methods disclosed. Many modifications and variations will be apparent to those of ordinary skill in the art without departing from the scope and spirit of the described devices and methods. The terminology used herein was chosen to best explain the principles of the devices and methods, the practical application or technical improvement over technologies found in the marketplace, or to enable others of ordinary skill in the art to understand the devices and methods disclosed herein.

While various examples are described herein, it will be appreciated from the specification that various combinations of elements, variations, or improvements therein may be made by those skilled in the art and are within the scope of the disclosure. In addition, many modifications may be made to adapt a particular situation or material to the teachings of the disclosed concepts without departing from the essential scope thereof. Therefore, it is intended that the concepts not be limited to the particular examples disclosed as the best mode contemplated for carrying out the devices and methods herein, but that the devices and methods will include all features falling within the scope of the appended claims.

What is claimed is:

1. A structure, comprising:
   a transformer having a primary side and a secondary side;
   a power supply connected to a center tap of the primary side of the transformer;
   an oscillator comprising a pair of switching transistors connected to each end of the primary side of the transformer;
   a pair of injection transistors connected to the pair of switching transistors; and
   a voltage source connected to each transistor of the pair of switching transistors of the oscillator,
      wherein each transistor of the pair of switching transistors of the oscillator and each transistor of the pair of injection transistors has a front-gate node and a back-gate node,
      wherein the back-gate node of each transistor of the pair of switching transistors is connected to the voltage source, and
      wherein output power from the secondary side of the transformer is controlled by adjusting the voltage source connected to the back-gate node of the pair of switching transistors.

2. The structure according to claim 1, wherein the front-gate node of each transistor of the pair of switching transistors is connected to each end of the primary side of the transformer.

3. The structure according to claim 1, wherein the voltage source connected to the back-gate node of the pair of switching transistors is adjusted independently for each transistor of the pair of switching transistors.

4. The structure according to claim 1, wherein the pair of injection transistors inject a desired frequency to the oscillator.

5. The structure according to claim 4, wherein the frequency is tuned by adjusting the voltage source to the back-gate node of the pair of switching transistors.

6. The structure according to claim 1, wherein each transistor of the pair of switching transistors and each transistor of the pair of injection transistors comprises a fully-depleted semiconductor-on-insulator (FDSOI) transistor.

7. The structure according to claim 1, wherein the secondary side of the transformer is configured for single ended output having one end of the secondary side of the transformer connected to ground.

8. The structure according to claim 1, further comprising:
an input transformer having a primary side and a secondary side, wherein the primary side of the input transformer has an RF input; and
each end of the secondary side of the input transformer is connected to a front-gate of one of the transistors of the pair of injection transistors.

9. The structure according to claim 8, further comprising:
a DC power supply connected to a center tap of the secondary side of the input transformer.

10. The structure according to claim 9, wherein the DC power supply provides voltage for the pair of injection transistors.

11. A power amplifier, comprising:
a transformer having a primary side and a secondary side;
a power supply connected to a center tap of the primary side of the transformer;
a pair of cross-coupled switching transistors connected to each end of the primary side of the transformer; and
a pair of injection transistors connected to the pair of cross-coupled switching transistors,
wherein each transistor of the pair of cross-coupled switching transistors and each transistor of the pair of injection transistors has a front-gate node and a back-gate node,
wherein an injection signal source is connected to the front-gate node of each transistor of the pair of injection transistors, and a bias voltage source is connected to the back-gate node of each transistor of the pair of cross-coupled switching transistors, and
wherein output power from the secondary side of the transformer is controlled by adjusting the bias voltage from a bias voltage source connected to the back-gate node of each transistor of the pair of cross-coupled switching transistors.

12. The power amplifier according to claim 11, wherein the front-gate node of each transistor of the pair of cross-coupled switching transistors is connected to each end of the primary side of the transformer.

13. The power amplifier according to claim 11, wherein a separate bias voltage source is connected to the back-gate node of each transistor of the pair of cross-coupled switching transistors, each separate bias voltage source being adjusted independently.

14. The power amplifier according to claim 11, wherein the pair of injection transistors inject a desired frequency to the cross-coupled switching transistors.

15. The power amplifier according to claim 14, wherein the frequency is tuned by adjusting a voltage source to the back-gate node of the cross-coupled switching transistors.

16. The power amplifier according to claim 11, wherein each transistor of the pair of cross-coupled switching transistors and each transistor of the pair of injection transistors comprises a fully-depleted semiconductor-on-insulator (FDSOI) transistor.

17. The power amplifier according to claim 11, further comprising:
an input transformer having a primary side and a secondary side, wherein the primary side of the input transformer has an RF input; and
each end of the secondary side of the input transformer is connected to the front-gate node of one of the transistors of the pair of injection transistors.

18. A method of controlling a power amplifier, comprising:
cross coupling a pair of switching transistors connected to the primary side of a transformer having a primary side and a secondary side;
providing an injection current to each transistor of the pair of switching transistors, wherein the injection current determines a desired frequency for the pair of switching transistors to oscillate the transformer;
measuring output power from the secondary side of the transformer;
determining if output power from both ends of the secondary side of the transformer are approximately equal; and
responsive to the output power from both ends of the secondary side of the transformer not being approximately equal, controlling output power of the pair of switching transistors by adjusting voltage to a back-gate of the pair of switching transistors.

* * * * *